United States Patent [19]
Hill

[11] 3,982,058
[45] Sept. 21, 1976

[54] MAGNETIC AND ELECTRIC FIELD SHIELDING OF COMPUTER COMPONENTS FROM LIGHTNING

[75] Inventor: Robert D. Hill, Santa Barbara, Calif.

[73] Assignee: The United States of America as represented by the Secretary of the Navy, Washington, D.C.

[22] Filed: May 13, 1975

[21] Appl. No.: 577,365

[52] U.S. Cl. ............................. 174/2; 174/35 MS
[51] Int. Cl.² ......................................... H05K 9/00
[58] Field of Search ....... 174/2, 35 R, 35 C, 35 MS, 174/35 TS; 244/1 A; 317/2 R, 2 E, 262 R; 325/357; 330/68, 170; 331/67; 335/301; 336/84 R; 340/174 S

[56] References Cited
UNITED STATES PATENTS

| | | | |
|---|---|---|---|
| 1,916,352 | 7/1933 | Williams, Jr. | 336/84 R |
| 1,933,261 | 10/1933 | Harris | 174/35 MS UX |
| 2,125,969 | 8/1938 | Turner | 331/67 X |
| 2,338,938 | 1/1944 | Hallett | 174/35 C X |
| 2,362,034 | 11/1944 | Stahl | 174/35 MS |
| 2,388,848 | 11/1945 | Howe | 174/35 MS |
| 2,424,790 | 7/1947 | Bachman et al. | 250/311 |

FOREIGN PATENTS OR APPLICATIONS

| | | | |
|---|---|---|---|
| 915,717 | 7/1946 | France | 174/35 MS |

Primary Examiner—Laramie E. Askin
Attorney, Agent, or Firm—R. S. Sciascia; L. I. Shrago; C. E. Vautrain, Jr.

[57] ABSTRACT

A multilayer cylindrical or rectangular shielding container oriented to protect computer components primarily from magnetic and electromagnetic field disturbances of cloud-to-ground electric lightning strokes is provided. The shielding container is formed of spaced magnetic and nonmagnetic walls. The container preferably is oriented vertically, and leads and cables entering and leaving the container are passed through the top and bottom ends thereof to provide maximum protection from electric fields and from the the predominantly horizontal components of the magnetic field vectors that propagate from such strokes.

5 Claims, 3 Drawing Figures

MAGNETIC AND ELECTRIC FIELD SHIELDING OF COMPUTER COMPONENTS FROM LIGHTNING

This invention concerns shielding of equipment from magnetic and electric field disturbances and, more particularly, shielding magnetic storage and memory devices from changes in magnetic and electric fields caused by lightning.

Electronic and solid state components such as magnetic storage and memory devices are or may be extremely sensitive to changes of magnetic and electric fields caused by lightning. More specifically, the vulnerability to malfunction and damage of computers exposed to nearby lightning discharges has been noted yet protection of such equipment has been limited to enclosing it in metal cabinets. Even where computer and computer-like equipment has been carried in aircraft, rockets, and spacecraft, no satisfactory shielding has been provided to protect the equipment from magnetic fields resulting from lightning strikes to the carrier.

The highest vulnerability of computer equipment to damage or malfunction due to natural phenomena at present exists when such equipment is carried in aircraft. The considerable probability of lightning strike to the fuselage of an aircraft also means a high probability of the generation of strong magnetic field disturbances in aircraft cabins. Magnetic compasses are known to have been disabled by lightning strikes to aircraft in flight, so it can be anticipated that the magnetic memories and solid state devices in computers would be more liable to damage or malfunction than magnetic compasses. The existence of a computer malfunction is, however, much more difficult to detect.

In the case of lightning or of electromagnetic pulse, EMP, disturbances from nuclear weapons, large transient magnetic fields on the order of from 1 to 100 gauss may occur which must be reduced to a few hundredths of a gauss in the immediate vicinity of computer and solid state elements. The frequency components in such transient magnetic as well as electric fields range from a few kilohertz, or less, to a few megahertz, or more. There are no known shields other than those of the present invention which are capable of reducing magnetic and electric field disturbances by a factor of substantially $10^6$, i.e. 60 db, at the peak frequency of a typical lightning pulse.

Accordingly, it is an object of the present invention to provide a method of and means for shielding magnetic storage and memory devices from changes in ambient magnetic and electric fields caused by lightning.

Another object of this invention is to provide magnetic or electric field shielding which is capable of reducing magnetic or electric field disturbances by a factor of substantially $10^6$.

A further object of this invention is to provide shielding for equipment from magnetic and electric fields caused by lightning which is directed solely to protecting magnetically sensitive components from changes in ambient magnetic and electric fields caused by lightning.

Other objects, advantages and novel features of the invention will become apparent from the following detailed description thereof when considered in conjunction with the accompanying drawings in which like numerals represent like parts throughout and wherein.

A lightning return stroke has an exceedingly wide frequency spectrum, and there is a considerable intensity of very low frequency magnetic field components which are not easily shielded out by employing materials which merely conduct away current. At close range $r$, on the ground, a vertical lightning stroke produces at time $t$ an intense magnetic induction field B given by:

$$B(r,t) = \frac{2}{r^2} \int_o^{I(t)} I(lt) \, dl \qquad (1)$$

where $I(l,t)$ is the current in the stroke at position $l$ from the ground. An approximate solution of equation (1) may be obtained by assuming that $I(l,t)$ is constant with $l$. Then, if $r << l$, the equation may be written:

$$B(r,t) = 2 \frac{I(t)}{r} \qquad (2)$$

It has been previously established that the probability of a lightning stroke developing a field B peak of 10 gauss at a range of 12.5 meters, such as in a strike close to a building, is substantially 10%. It can be estimated that the field at a computer that might cause malfunction could be as low as 0.07 gauss, or less. Thus, a shielding efficiency of substantially 1,000 would be required to offset or avoid malfunction in 10% of the strikes near a building at a distance therefrom on the order of from 30 to 40 feet. In the case of aircraft, spacecraft, etc. the efficiency factor required is much larger because the strokes and conduction channels on the skin of the craft are usually very much closer to the equipment than 30 feet, and the currents to the craft are generally very much more intense than those to the ground. These criteria indicate a required shielding efficiency on the order of $10^6$, and such an efficiency is provided in the present invention by positioning at least 3 spaced layers of enclosing material about the equipment to be protected.

Figure 1:
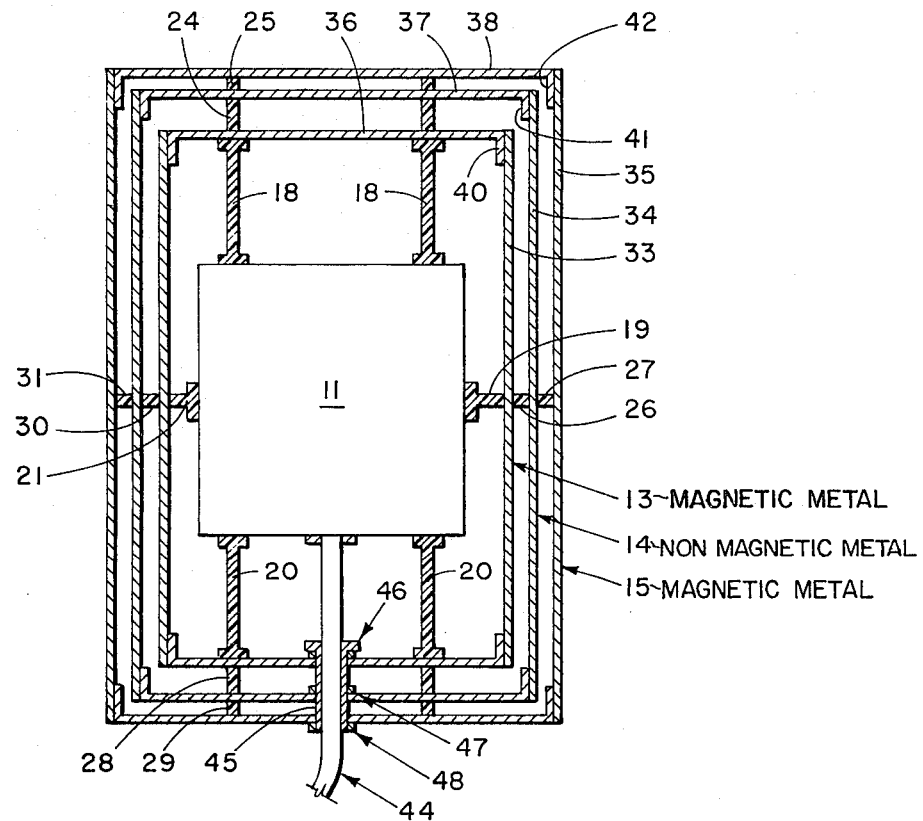
FIG. 1 is a schematic drawing partly in axial or vertical section of a cylindrical or rectangular form of multilayer equipment shield.

Referring to the drawing, FIG. 1 shows a preferred embodiment of the invention in which an equipment module 11 is protected by three individual metal enclosures or containers 13, 14 and 15 of which inner container 13 is preferably a Mumetal or Permalloy can having a thickness on the order of from 3 to 5 mm, intermediate container 14 is preferably made of copper or aluminum and has a thickness on the order of 2 to 3 mm, and outer container 15 is made of the same material and has substantially the same thickness as inner container 13. The magnetic material preferred for use in container 13 and 15 contains relatively high concentrations of nickel and iron, customarily ranging in the amount of 45 to 80 percent nickel and 50 to 20 percent iron. Such alloys have trade names like Mumetal, Permalloy, Hypernik and so forth, and their permeabilities are in the range of 20,000 and more for magnetizing fields of a few tenths of a gauss and less. However, these materials are expensive, and for large containers cost savings will be obtained by substitution of such materials as plain iron and silicon steel. The permeabilities of these materials, which are not preferred, lie in the range of 1000, and the shielding capabilities of these materials are correspondingly lower than those of the high permeable alloys. Silver and gold are alternative metals for use in intermediate shield 14, however, they are not preferred primarily because of their cost.

Shields 13, 14 and 15 preferably are spaced on the order of 5 mm from each other depending upon the gross size of the three-element container shield. Large containers may require larger spacings in order to provide tolerances from elements contacting each other. Spacings are not critical but they should not be larger than a few times the thickness of the magnetic shielding material. Such spacing preferably is obtained by securing a plurality of spacers 18–21 made of suitable dielectric material such as Lucite, Bakelite, etc., to equipment module 11 and securing enclosing containers 13–15 successively to such spacers and extensions thereof 24–31. The containers in this embodiment are formed of peripherally separated cylindrical or rectangular sections 33–35 which are closed by end caps 36–38, respectively. Each cylindrical or rectangular section preferably has inserted into it end circular or rectangular caps as indicated at 40–42 to form an unbroken exterior surface to the sections. The end caps may be secured to their respective sections by conventional means such as metal screws made of the same material as the enclosure, and the spacers may be secured to the module and the spacer extensions to the respective spacers preferably by cementing. A cable connection 44 to the equipment traverses a copper lead-through sleeve or conduit 45 and couplings 46–48 all of which are shown in greater detail in FIG. 3.

Figure 2:
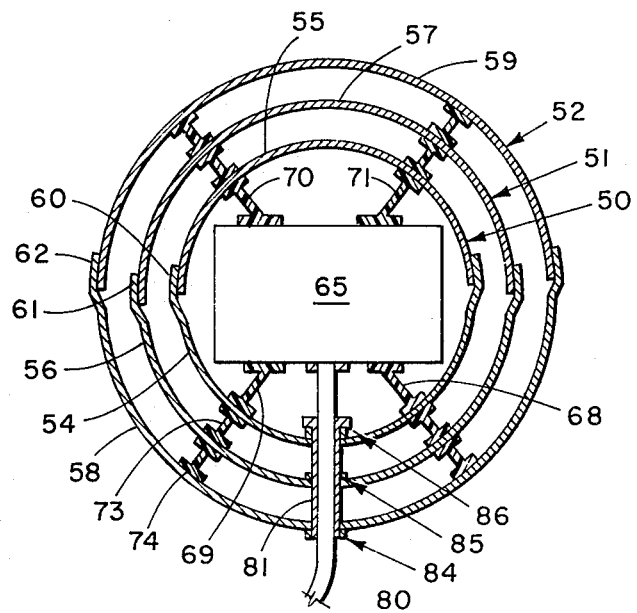
FIG. 2 is a schematic drawing partly in section of a spherical multilayer aircraft equipment shield.

In FIG. 2, a multilayer equipment shield for use in aircraft is shown which includes three individual spherical metal enclosures or containers 50, 51 and 52 of which inner container 50 is preferably made of a Mu-metal or Permalloy intermediate container 51 is preferably made of copper or aluminum, and outer container 52 is made of the same material as inner container 50. Containers 50–52 preferably are made in two sections 54–55, 56–57 and 58–59 which preferably are joined in overlapping fashion as indicated at 60, 61 and 62. Containers 50–52 are assembled about an equipment module 65, which may be a computer, by spacers 68–71 and extensions thereof as indicated at 73 and 74. As in the cylindrical and rectangular can arrangements of FIG. 1, the respective sections are held together preferably by metal screws made of the same material as the enclosures, and the spacers preferably are secured to the module and to successive outer containers preferably by cementing. A cable connection 80 traverses a copper lead-through sleeve 81 and couplings 84–86 to equipment module 65.

Figure 3:
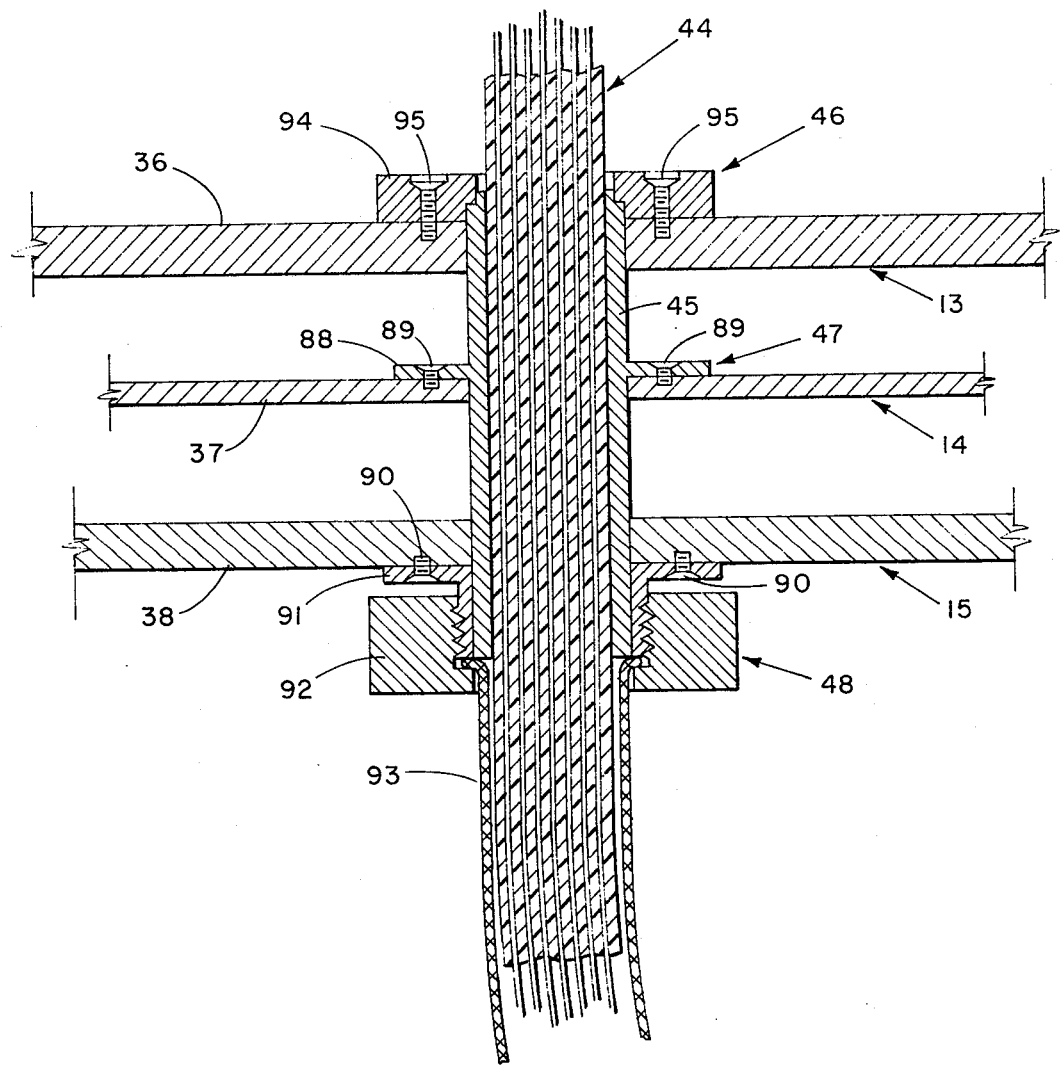
FIG. 3 is a schematic drawing partly in section of a cable connection through the magnetic shielding.

FIG. 3 shows a preferred method and means for passing a cable through the magnetic shielding to provide external connections for an equipment module. Cable 44, containing a plurality of connectors, penetrates through metal shielding containers 13, 14 and 15 via sleeve or conduit 45 which preferably is made of copper but may be made of aluminum, silver or gold. Sleeve 45 is affixed to intermediate container 14 by having a flange 88 made integral therewith and securing the flange to one of the container walls such as wall 37 by bolts 89 which are made of the same material as sleeve 45. Sleeve 45 penetrates through container 15, the outer ferrous metal shield, and is secured thereto by bolts 90 which attach a bracket 91 to wall 38 and to which a coupling nut 92 is secured. A flexible shield 93 preferably made of braided metal covers cable 44 and is secured by conventional means such as pinching or crimping between bracket 91 and coupling nut 92. Sleeve 45 penetrates through container 13, the inner ferrous metal shield, and is secured thereto by a ferrous metal retaining ring 94 and bolts 95. Bolts 90 and 95 are made of the same material as the walls to which they are secured.

The containers in each embodiment are spaced an identical distance apart and, as stated supra, the spacing may be on the order of 5 mm depending upon the size of the shield. In those shields for use in aircraft, spacecraft, and the like, the efficiency factor and, therefore, the thickness of each container and the spacing between containers should be larger than the similar components of the ground-based embodiment of FIG. 1 because of the closer proximity of the module in the aircraft to the lightning strokes and the conduction channels on the skin of the aircraft. It is believed, however, that a shielding efficiency on the order of $10^6$ is adequate in the aircraft embodiment.

The method of and means for effecting external connections to the electrical equipment to be shielded, although not a primary feature of the invention, must insure that all penetrations through the metal shielding walls of the containers are enclosed by further continuous metal coverings such as coupling collars, rings, flexible braiding shielding, etc. This is essential in order that no insertions into the enclosure introduce weaknesses in the metal shield or, if weaknesses cannot be avoided, that they be reduced as much as possible. The connector system shown in FIG. 3 is preferred and is most readily installed starting from the outer shield and working to the inner shield. In any connector system used, the cable connector should enter the enclosure through its fixed base sections.

Obviously many modifications and variations of the present invention are possible in the light of the above teachings. For example, the spacing between the modules and the successive surrounding containers may be achieved by placing non-conductive sheet material such as plastic sheet, fiber lamination, asbestos, etc., between these components or by other similar means. Also, the shielding material for cancelling electric or electromagnetic fields could be of any suitable conducting material or copper plated with aluminum or other such material or a conducting alloy.

What is claimed is:

1. A shield system surrounding electrical components for protecting them from changes in magnetic and electric fields caused by lightning comprising:

at least three walls of metal surrounding said components, said walls forming a plurality of containers which have a total shielding efficiency on the order of $10^6$, the outer and inner of said walls being made of magnetic metal for providing shielding from magnetic field disturbances of cloud-to-ground electric lightning strokes, the walls intermediate said outer and inner walls made of a highly conductive non-magnetic metal for providing shielding from electric field disturbances of cloud-to-ground electric lightning strokes, said walls being spaced apart from one another, said containers being held spaced apart by dielectric material cemented to the containers; and a conduit extending through said containers and leads and cables entering and leaving said containers through said conduit;

said conduit formed by continuous metal surfaces and said cables and leads having a flexible metallic covering which terminates at the conduit, said conduit positioned to enter and leave the bottom ends of said containers in view of preponderantly horizontal magnetic field vectors that propagate from said lightning strokes.

2. The system of claim 1 wherein said electrical components comprise a computer and said conduit is made of the same material as said intermediate containers and is secured thereto by a fitting made integral with the conduit.

said conduit penetrating said inner and outer containers and being secured thereto by fittings made of the same material as are the respective containers.

3. The system of claim 2, wherein said containers are three in number and said intermediate container is made of copper having a thickness of from 2 to 3 mm, said inner and outer containers made of an alloy having concentrations of from about 45 to 80 percent nickel and 50 to 20 percent iron and having a thickness of from 3 to 5 mm.

4. The system of claim 3 wherein said computer is situated in an aircraft of spacecraft and said containers are spherical in shape and are positioned symmetrically about said computer.

5. A method of protecting electrical devices from changes in magnetic and electrostatic fields caused by lightning comprising:

entrapping a substantial portion of the magnetic field by enclosing the devices in a shield of magnetic metal symmetrically deployed a selected distance from the devices;

cancelling the electrostatic field by enclosing the devices in a shield of non-magnetizable metal symmetrically deployed within and spaced from said magnetic field entrapping shield;

entrapping and cancelling any remaining magnetic fields by enclosing the devices in a shield of magnetic metal symmetrically deployed within and in close proximity of said electrostatic field cancelling shield; and forming a passage through said shields for accommodating cables and leads by installing a tubular member through said shields, the walls of said tubular member being made of the same material as the shield for cancelling said electrostatic field.

* * * * *